(12) United States Patent
Le et al.

(10) Patent No.: US 6,643,177 B1
(45) Date of Patent: Nov. 4, 2003

(54) METHOD FOR IMPROVING READ MARGIN IN A FLASH MEMORY DEVICE

(75) Inventors: Binh Quang Le, San Jose, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/349,293

(22) Filed: Jan. 21, 2003

(51) Int. Cl.[7] ............................................. G11C 16/28
(52) U.S. Cl. ............................ 365/185.2; 365/185.19; 365/185.22; 365/185.28; 365/185.24; 365/185.33
(58) Field of Search .......................... 365/185.2, 185.19, 365/185.18, 185.22, 185.24, 185.28, 185.33, 185.11

(56) References Cited

U.S. PATENT DOCUMENTS 6,519,184 B2 * 2/2003 Tanaka et al. ......... 365/185.22

* cited by examiner

Primary Examiner—Andrew Q. Tran
(74) Attorney, Agent, or Firm—Wagner, Murabito & Hao LLP

(57) ABSTRACT

A method for providing a modified threshold voltage distribution for a dynamic reference array in a flash memory cell array. The dynamic reference array and an associated core memory cell array are programmed using two different programming processes to produce different $V_t$ distributions for the dynamic reference array and the core memory cell array. The dynamic reference array is programmed using a finer program pulse to achieve a smaller distribution width, thus enhancing the read margin for the memory cell array. The finer pulse may be of shorter duration or of smaller amplitude. The finer programming process may be applied to one or more threshold voltage distributions (states) in the memory cell array.

20 Claims, 9 Drawing Sheets

METHOD FOR IMPROVING READ MARGIN IN A FLASH MEMORY DEVICE

TECHNICAL FIELD

The present invention relates to a non-volatile memory. Specifically, the present invention relates to a method for programming a flash memory device with a dynamic reference array.

BACKGROUND ART

Many electronic devices, such as computers, personal digital assistants, cellular telephones, digital cameras and similar systems and devices include processors and memory. The memory is used to store computer programs to be executed by the device and/or data operated on by the processors to achieve the functionality of the device. Many devices and systems require that this information be retained in permanent storage/non-volatile medium so that tile data and computer programs is not lost when power is removed.

Flash memory is an example of a non-volatile memory device. Flash memory devices use a memory cell transistor that is similar to a metal-oxide semiconductor field effect transistor (MOSFET) with an additional floating gate structure disposed in the insulating layer between the control gate, and the source and drain. The channel between the source and drain is separated from the floating gate by a thin dielectric layer.

Programming of a memory cell is done by applying the appropriate potentials to the control gate, source, and drain so that electrons are transferred to the floating gate through the thin dielectric layer. The addition of electrons to the floating gate increases the threshold voltage for the transistor above the value for an uncharged floating gate. Two techniques used for electron transfer across the dielectric layer are channel hot electron (CHE) and Fowler-Nordheim tunneling.

A read operation is performed by biasing the source and drain while applying a read voltage that is above the threshold voltage ($V_t$) for an unprogrammed cell and below the threshold voltage for a programmed cell. An unprogrammed cell will conduct current at the applied read voltage, and thus may represent a logical "1", whereas a programmed cell will not conduct, and may represent a logical "0." The erasure of a memory cell is carried out by applying potentials to the control gate, source, and drain so that electrons are removed from the floating gate, thus lowering the threshold voltage.

Conventional flash memory devices utilize transistors that store a single bit per transistor and have a floating gate that is a conductor, such as polysilicon. Multi-bit memory cells have been developed that allow for storing more than one bit per transistor. These transistors may use a single floating gate with multiple programming levels, a split floating gate to provide more than one charge storage site, or a dielectric layer (in place of a floating gate) in which charge may be locally stored in multiple sites.

An example of a dielectric layer used for charge storage is a composite ONO layer (silicon nitride sandwiched between two layers of silicon dioxide). This layer may be used in a dual-bit memory cell that can store two bits per cell; however, the aging and cycling characteristics of the ONO layer are different from the conventional polysilicon floating gate.

When used for charge storage in a memory cell, an ONO layer may develop an increase in charge loss with cycling, giving rise to different I–V characteristics at the end of life as compared to the I–V characteristics at the beginning of life for the device. In order to accommodate the changing I–V characteristics in the read operation, a dynamic reference array may be used in place of a static reference.

A dynamic reference array includes a set of memory cells that are programmed and erased along with the core memory cells of a flash memory device. Thus, the aging associated with the ONO layer essentially becomes a common mode error that can be canceled out by being introduced at both inputs of the comparator used in the read operation. As the $V_t$ distributions shift for the programmed states of the memory cell, the reference levels shift as well, allowing the reference to remain centered between the programmed states.

Although the dynamic reference array can be used to adjust the reference voltage used for determining the programmed state of a memory cell, there is still the problem of reduced read margin that may occur. For example, the threshold voltages associated with two programmed states may decrease over time, with a concomitant decrease in the separation between the $V_t$ distributions of the two programmed states. This decreased separation reduces the margin for error in the read operation. In the worst case of overlapping distributions, the read operation cannot be performed reliably.

DISCLOSURE OF THE INVENTION

A method for providing a modified threshold voltage distribution for a dynamic reference array in a flash memory cell array is disclosed. The dynamic reference array and an associated core memory cell array are programmed using two different programming processes to produce different $V_t$ distributions for the dynamic reference array and the core memory cell array. The dynamic reference array is programmed using a finer program pulse to achieve a smaller distribution width, thus enhancing the read margin for the memory cell array.

In an embodiment of the present invention, a first programming pulse is used to program a core memory cell in a memory cell array. The pulse is applied using a program/verify cycle. A reference cell in the memory cell array is also programmed with a program/verify cycle, using a second pulse having a shorter duration than the first. The programming of core memory cells and their associated reference cells may be repeated for a number of cells. The shorter duration of the programming pulse used for the reference cells results in a smaller standard deviation in the reference cell $V_t$ distribution, as compared to the core cell $V_t$ distribution, thus improving the read margin.

In another embodiment of the present invention, a first programming pulse is used to program a core memory cell in a memory cell array. The pulse is applied using a program/verify cycle. A reference cell in the memory cell array is also programmed with a program/verify cycle, using a second pulse having a smaller amplitude than the first. The programming of core memory cells and their associated reference cells may be repeated for a number of cells. The smaller amplitude of the programming pulse used for the reference cells results in a smaller standard deviation in the reference cell $V_t$ distribution, as compared to the core cell $V_t$ distribution, thus improving the read margin.

BEST MODES FOR CARRYING OUT THE INVENTION

Reference will now be made in detail to the preferred embodiments of the present invention, a method for improving read margin in a flash memory device. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
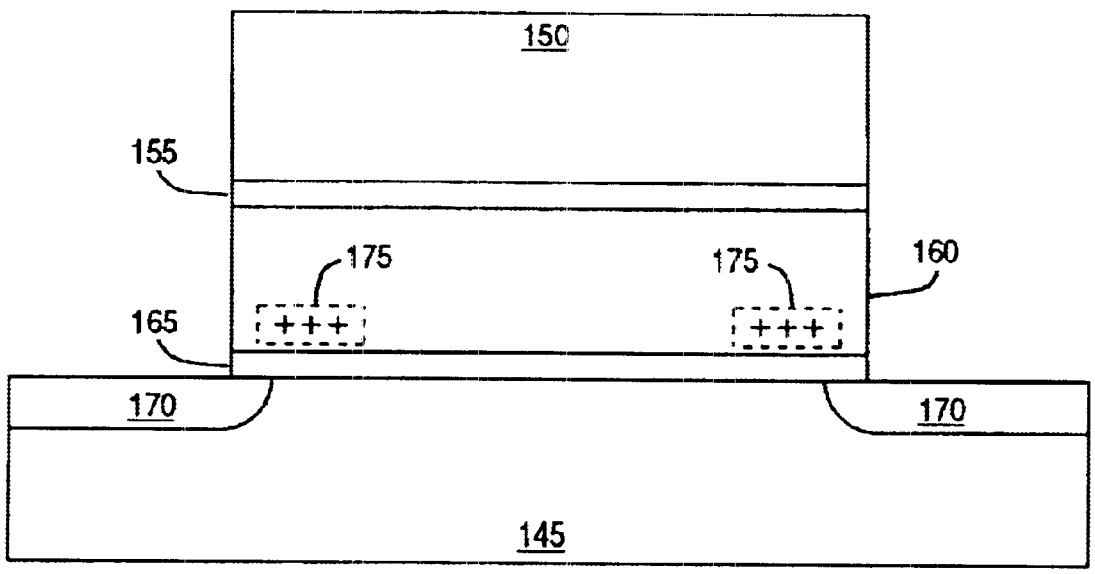
FIG. 1 shows a diagram of a non-volatile memory cell with a dielectric charge storage element.

FIG. 1 shows a diagram of a memory cell with a dielectric storage element 160. Symmetric source/drains 170 are fabricated in a substrate 145, and separated from the storage element 160 by an oxide 165. The control gate 150 is separated from the floating gate by an oxide 155. In writing to the memory cell, a charge 175 is transferred across the oxide 165 into the storage element 160. The storage element 160 may be injected with two distinct charges 175, each located near a symmetric drain/source 170. The charge transfer may be effected by Fowler-Nordheim tunneling or channel hot electron injection (CHE).

Figure 2:
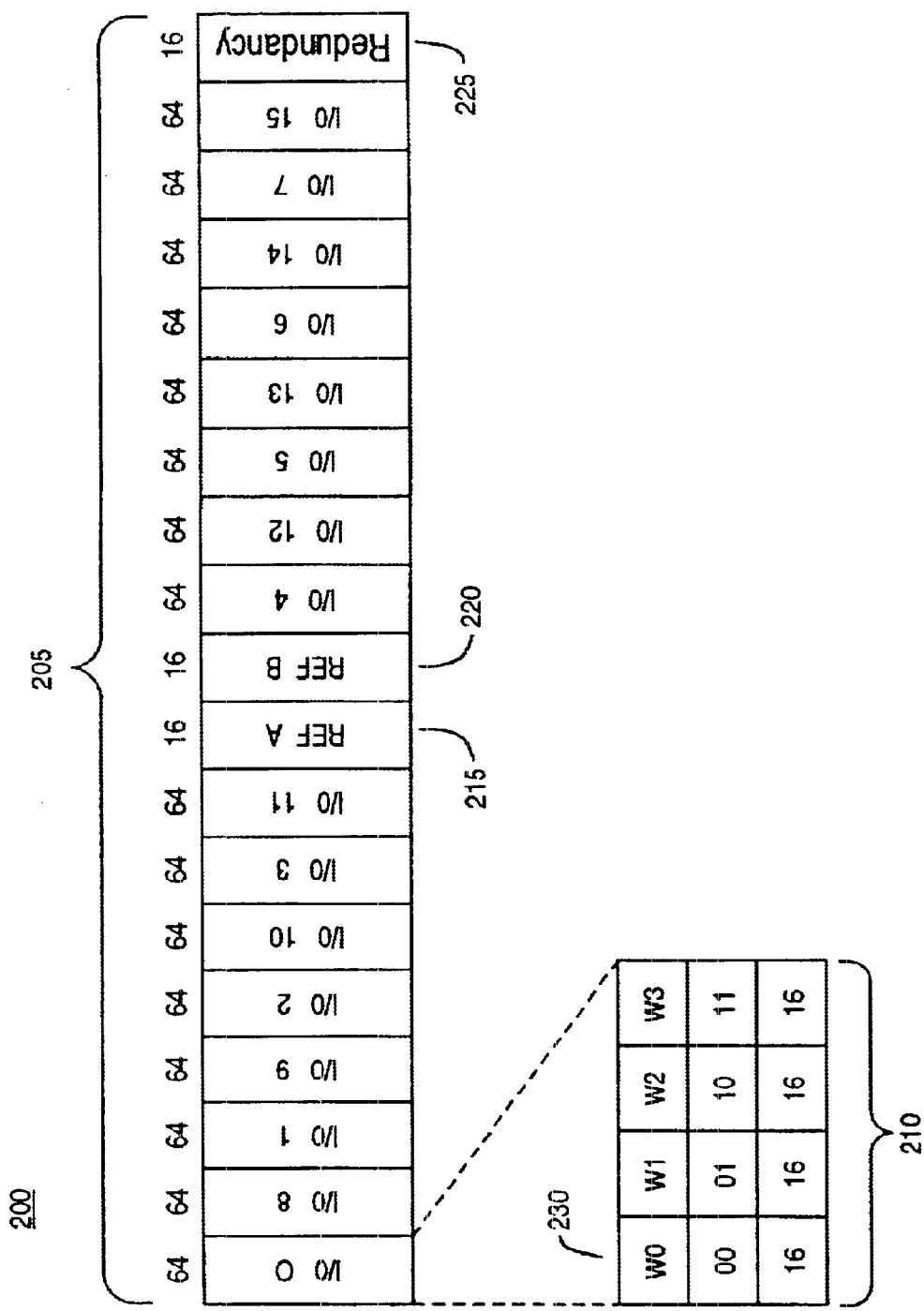
FIG. 2 shows a memory cell array sector layout with a core memory cell array and a dynamic reference memory cell array in accordance with an embodiment of the present claimed invention.

FIG. 2 shows an example of a memory cell array sector layout 200. A sector 205 comprises I/O blocks I/O0–I/O15 that form the core memory array, reference blocks 215 and 220, and a redundancy block 225. As shown, the redundancy block may be physically separate from the remainder of the sector. Each I/O block 210 comprises 4 sub-I/Os 230, each with a width of 16 cells. Each sub-I/O (w0, w1, w2, w3) has an associated word number (00, 01, 10, 11). The reference blocks 215 and 220, and the Redundancy block 225 are each 16 cells wide.

The basic unit of width for the sector 205 is 16 cells, and a common Y-decoder structure with an addressable width of 16 cells may be used to address each block. The total number of decoders required is 67, with 64 decoders for the 16 I/O blocks I/O0–I/O15, 2 decoders for the reference blocks 215 and 220, and one decoder for the redundancy block 225. The sector 205 has an overall width of 1072 cells, and may have a height of about half of the width, e.g., 512 cells high. The inclusion of the reference memory cells in the same sector as the core memory cells, combined with dynamic programming, provide optimum tracking of the reference memory cells and core memory cells at beginning of life (BOL) and end of life (EOL). In this example the ratio of core cells to reference cells is 32:1; however, other values may be used. There will generally be a reference cell block for each logical state (e.g., 0 and 1).

In a dynamic reference array, the reference memory cells are programmed and erased in concert with the core memory cells that utilize the reference value provided by the dynamic reference array. This provides an automatic adjustment for changes in the memory cell behavior that is the result of aging (time/temperature) or the number of write/erase cycles. A dynamic reference array may be used for single-bit memory cells or multiple-bit memory cells. Dynamic reference arrays are particularly useful for flash memory devices that are fabricated using a process or design that has uniform aging characteristics, as opposed to catastrophic failure. For example, an oxide defect in a memory cell with a polysilicon floating gate may cause most of the stored charge to be lost, whereas in a cell with a dielectric storage element, the charge loss would be limited due to low charge mobility in the dielectric.

Figure 3:
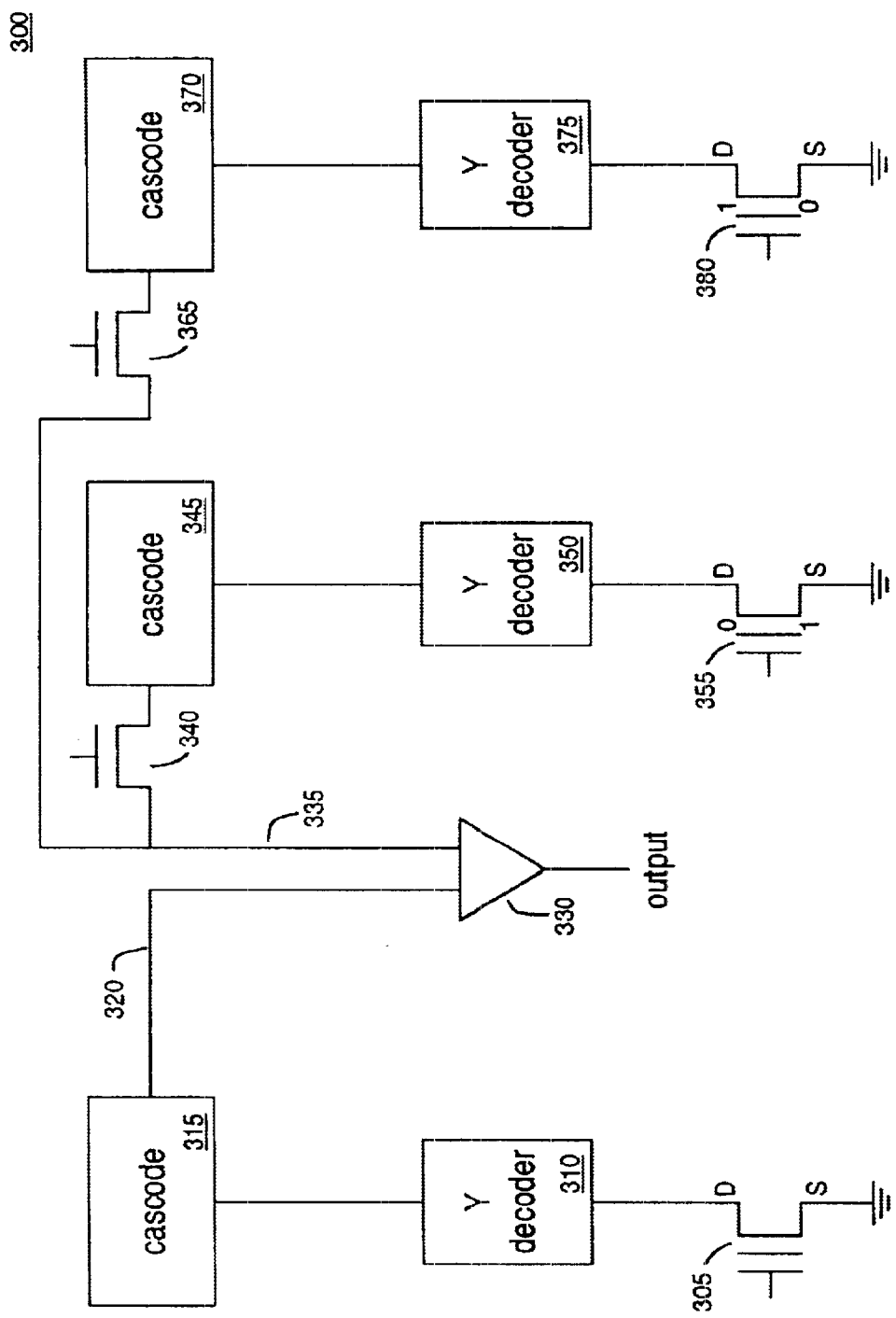
FIG. 3 shows a read circuit with multiple reference cells in accordance with an embodiment of the present claimed invention.

FIG. 3 shows a read circuit with multiple reference cells in accordance with an embodiment of the present invention. The read circuit 300 comprises a non-volatile memory cell 305 coupled to a cascode circuit 315 by a Y-decoder 310. In this embodiment, the memory cell 305 comprises a dielectric charge storage medium (e.g., an ONO layer). The read voltage signal 320 is output from the cascode 315 to a first input of the sense amplifier 330. A reference voltage signal 335 is coupled to the second input of the sense amplifier 330. The reference voltage signal 335 is obtained from the combination of cascode 340 and cascode 365.

Cascode 345 is coupled to a Y-decoder 350 and a first reference cell 355. The signal from cascode 345 may be switched by a transistor 340. Similarly, Cascode 370 is coupled to a second reference cell 380 by a Y-decoder 375. The signal from cascode 370 may switched by a transistor 365. The output of cascode 345 and cascode 370 provide the reference voltage signal 335 to the sense amplifier 330. The current to voltage conversion of the cascodes 345 and 370 may also provide attenuation relative to the conversion of cascode 315. For example, cascode 345 and cascode 370 may each provide 3 dB of attenuation, resulting in a combined output that is an average of their inputs when switches 340 and 365 are closed. In this example, reference cell 355 is a reference "1," and reference cell 380 is a reference "0."

Figure 4A:
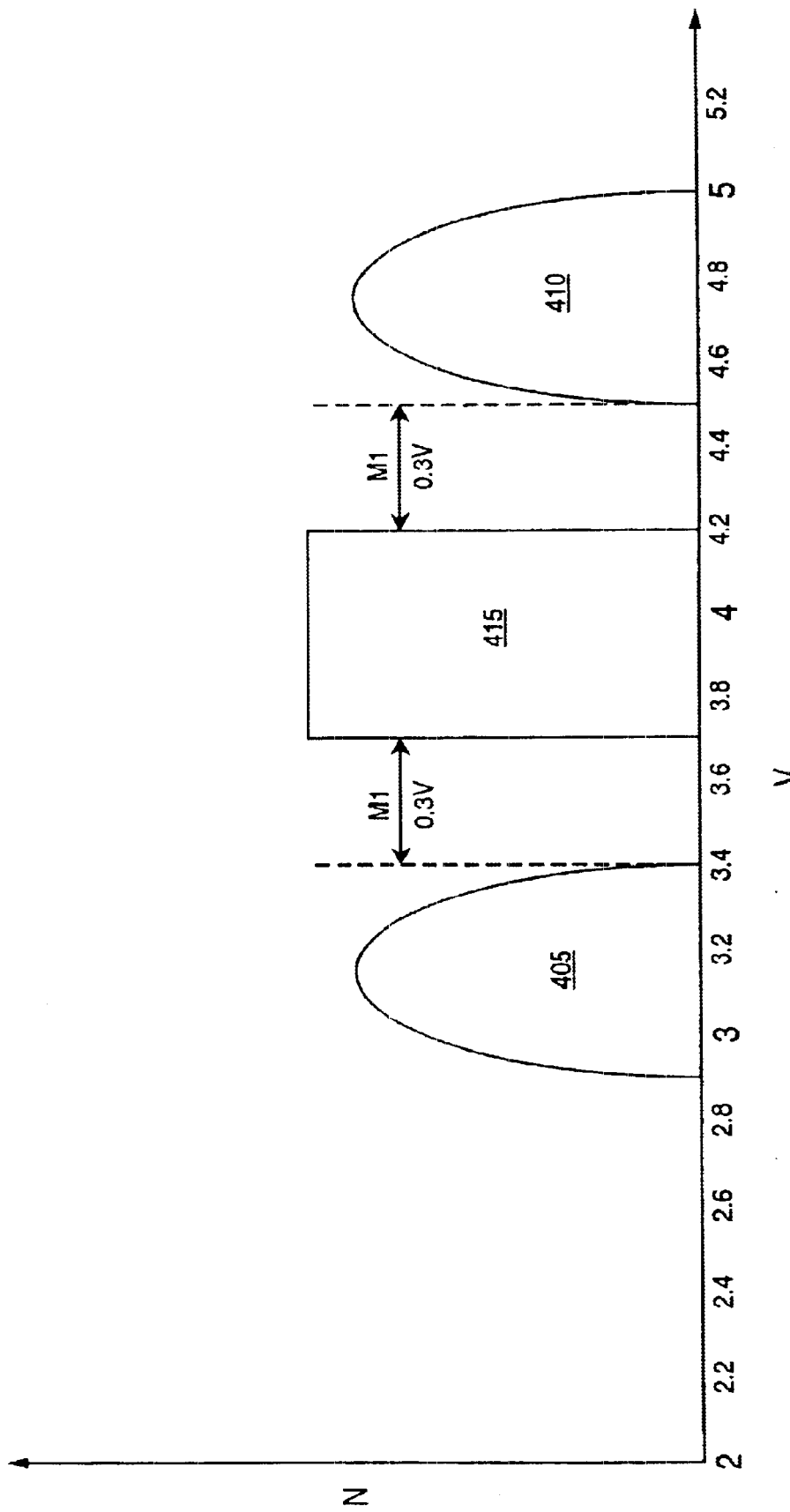
FIG. 4A shows an example of the threshold voltage ($V_t$) distributions in a memory cell array having a read margin of 0.3V using a common process for core and reference cell programming.

FIG. 4A shows an example of the threshold voltage $V_t$ distributions in a memory cell array having a read margin of 0.3V using a common process for core and reference cell programming. Since a common process is used for programming, distribution 405 represents the identical $V_t$ distributions of the core and reference cells of the first state (e.g., 1), and distribution 410 represents the identical $V_t$ distributions of the second state (e.g., 0). Distribution 405 and 410 each have a width of 0.5V. It should be noted that the association of a logical value (0 or 1) with a particular $V_t$ is arbitrary.

As previously described, a reference value for read operations may be obtained from the average of the two states. Thus, region 415 represents the range of possible values for a reference value that is obtained from distributions 405 and 410. The read margin M1 in this case is equal to 0.3V. It should be noted that the distributions shown are schematic, and are primarily intended to portray the width or limits of an actual distribution. No particular inference should be made from the shape of the curves, or the area underneath.

Figure 4B:
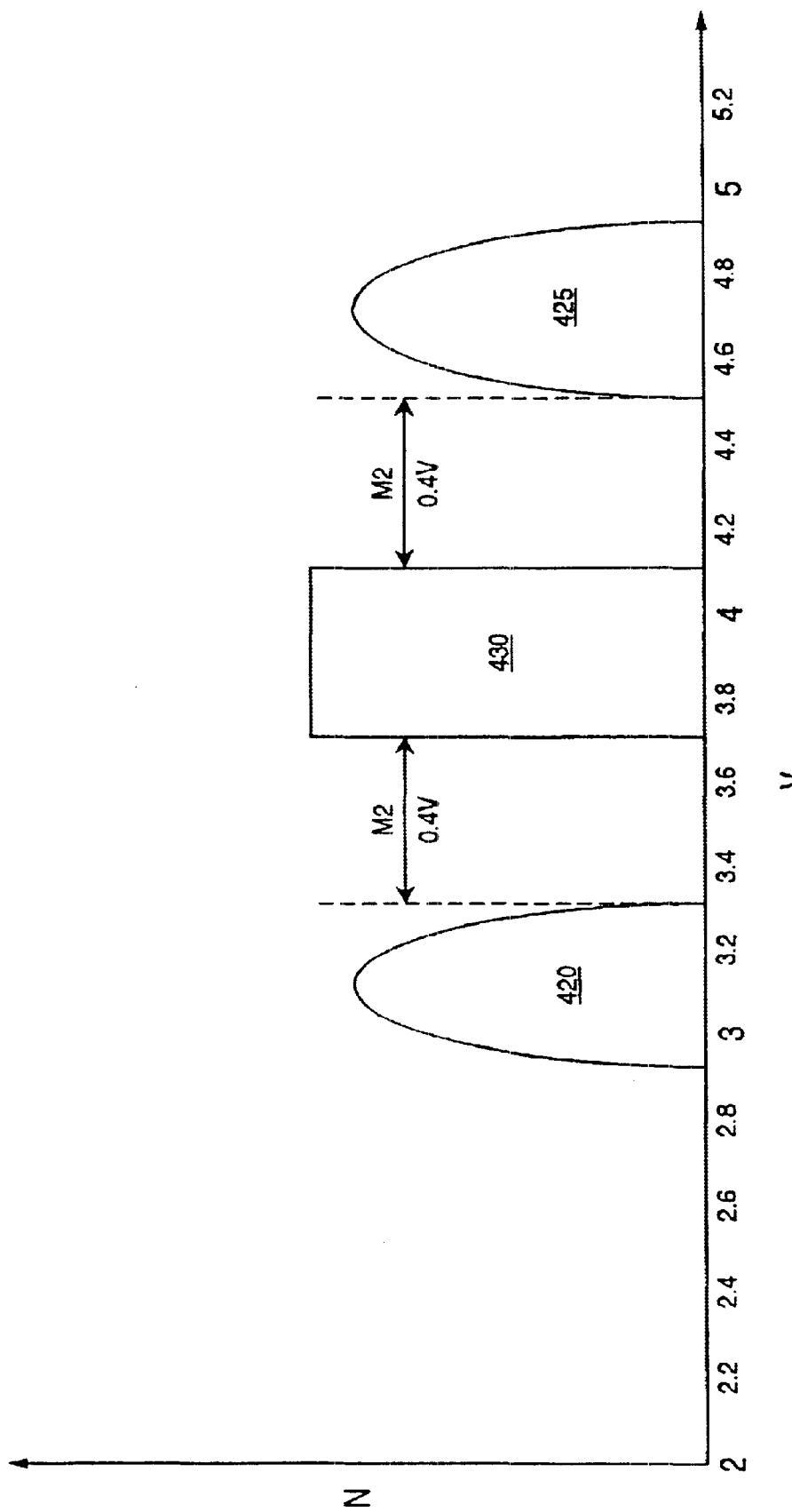
FIG. 4B shows an example of the threshold voltage $V_t$ distributions in a memory cell array having a read margin of 0.4V using a common process for core and reference cell programming.

FIG. 4B shows an example of threshold voltage $V_t$ distributions similar to that of FIG. 4A, but with narrower distributions. In this example distributions 405 and 410 each have a width of 0.4V, providing a read margin M2 of 0.4V. Since the core and reference distributions are narrower than those of FIG. 4A, the reference value range 430 is decreased and the read margin M2 is increased.

Figure 4C:
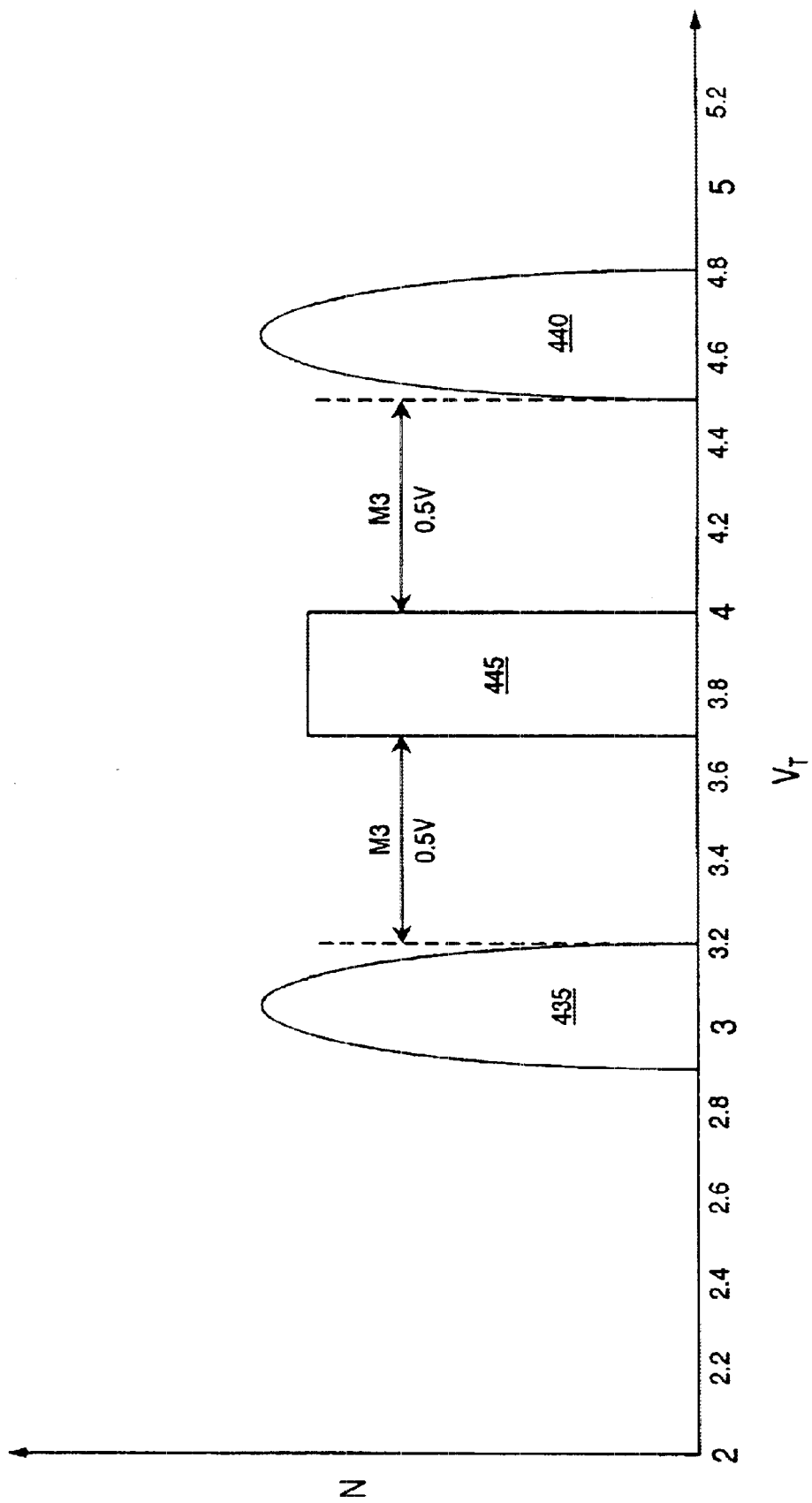
FIG. 4C shows an example of the $V_t$ distributions in a memory cell array having a read margin of 0.5V using a common process for core and reference cell programming.

FIG. 4C shows a further example of the effect of narrower $V_t$ distributions. In this example the width of the core and reference $V_t$ distributions 435 and 440 is 0.3V. The reference value range 445 is reduced and the read margin M3 is 0.5V.

Figure 5A:
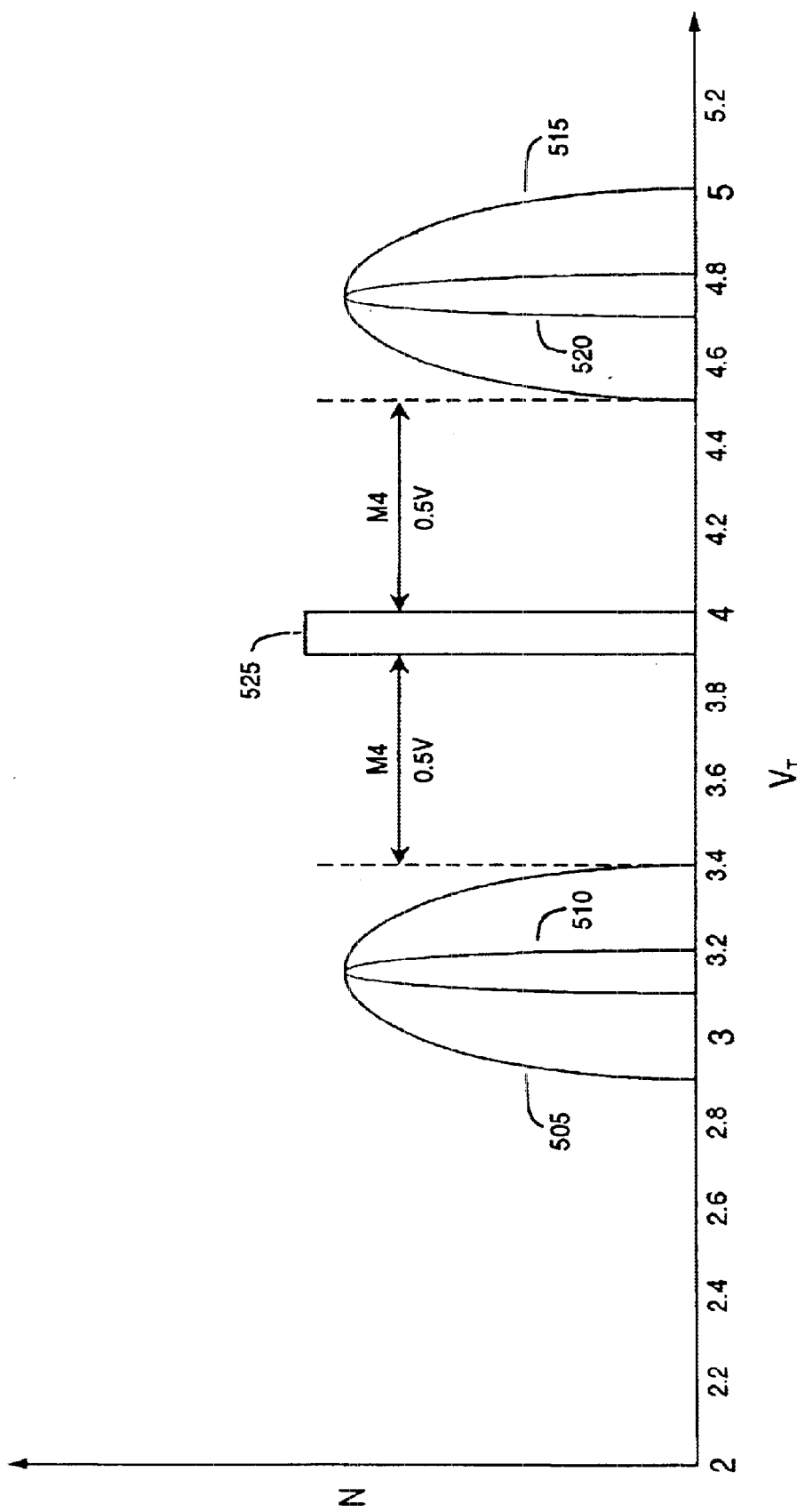
FIG. 5A shows an example of the $V_t$ distributions in a memory cell array with a core memory cell distribution width of 0.5V and a reference cell $V_t$ distribution width of 0.1 volt in accordance with an embodiment of the present claimed invention.

FIG. 5A shows an example of the $V_t$ distributions in a memory cell array with a core memory cell distribution width of 0.5V and a reference cell $V_t$ distribution width of 0.1 volt in accordance with an embodiment of the present claimed invention. In this example, the core memory cells are programmed with a process that produces a distribution width of 0.5V (505, 515), similar to the core memory cell distribution of FIG. 4A. Thus, decreasing the distribution width of the reference cell distribution (510, 520) from 0.5V (FIG. 4A) to 0.1V has resulted in a decrease of the reference value range 525 to 0.2V and an increase of the read margin M4 from 0.3V (FIG. 4A) to 0.5V.

The narrower reference cell distribution is achieved by using a different programming pulse for programming the reference cells than that used for programming the core cells. The programming of the reference cells may be done with a finer programming pulse that is either shorter in duration, or smaller in amplitude, than the pulse used for programming the core cells. Programming is typically done as an incremental operation with alternating write pulses and verify operations. The use of a shorter pulse, or lower voltage pulse, will reduce the incremental programming charge and thus reduce the width of the $V_t$ distribution. The use of a finer programming pulse may also be applied to a write operation (e.g., soft programming) used to tailor or adjust erased cells. A programming process that uses a finer pulse is referred to as a finer programming process.

Since there are typically many more core cells than reference cells, the increase in overhead due to the use of a finer programming pulse for reference cells is relatively small compared to the increase in read margin that is achieved. The programming of the core cells and reference cells may be done using the same basic write/verify algorithm, but with different pulse waveforms. Alternatively, the programming of the reference cells may be done using a different algorithm. For example, core memory cells may be programmed with a pulse waveform that is unchanging during the write/verify cycle, whereas the reference cells are programmed with a pulse waveform that decreases in duration and/or amplitude during the write/verify cycle. If the core memory programming uses a variable pulse, the reference programming will use a variable pulse that is correspondingly finer.

Figure 5B:
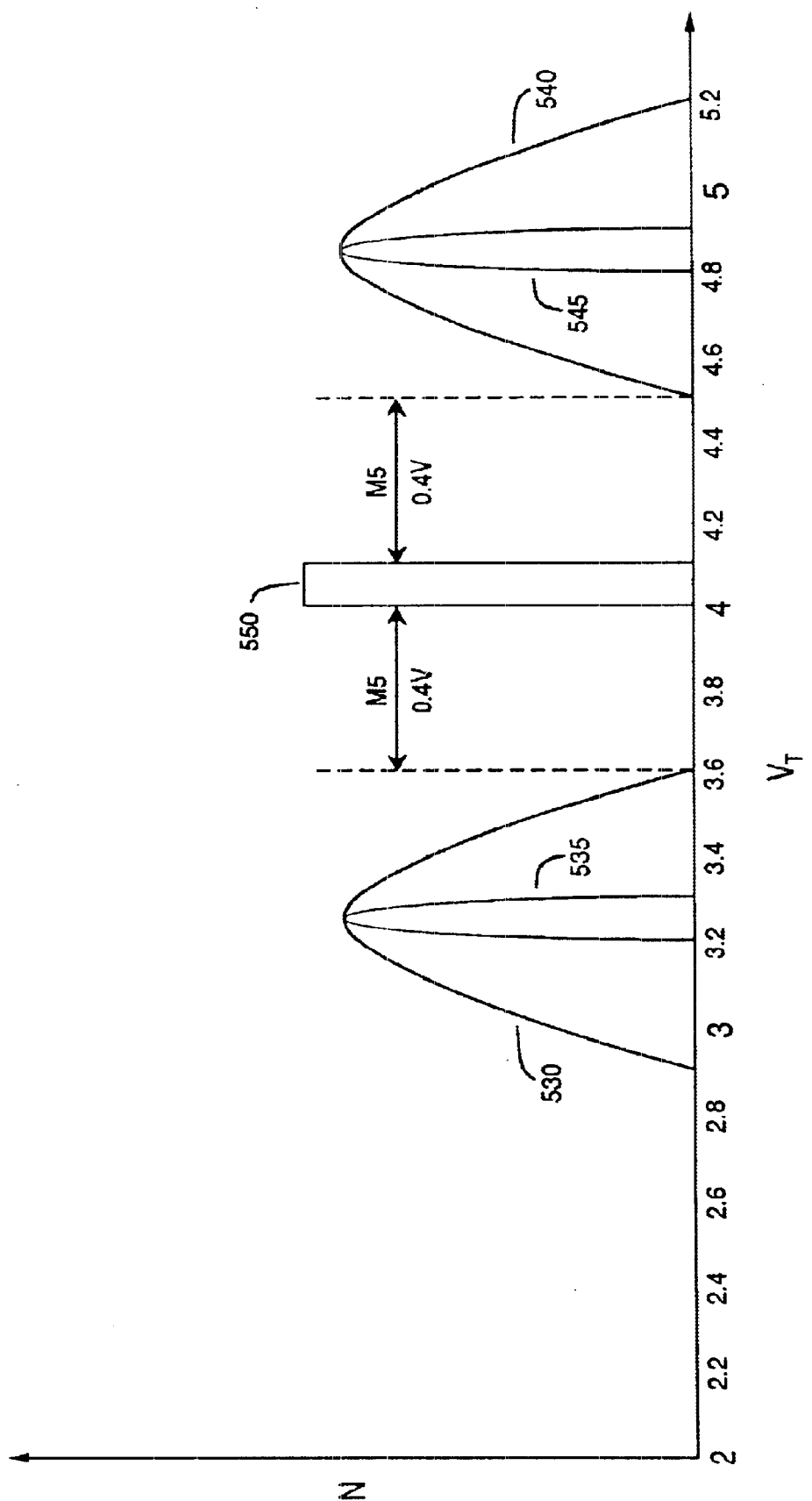
FIG. 5B shows an example of the $V_t$ distributions in a memory cell array with a core memory cell distribution width of 0.7V and a reference cell $V_t$ distribution width of 0.1 volt in accordance with an embodiment of the present claimed invention.

FIG. 5B shows an example of the $V_t$ distributions in a memory cell array with a core memory cell distribution width of 0.7V (530, 540) and a reference cell $V_t$ distribution width of 0.1V volt in accordance with an embodiment of the present claimed invention. In this example, the width of the core distribution (530, 540) is relaxed to 0.7V from the 0.5V of FIG. 5A. In spite of the larger core distribution width, the read margin M5 is still 0.4V. This compares favorably to the scheme of FIG. 4A in which the core distribution width is 0.5V (405, 410) and the read margin M1 only 0.3V.

Figure 5C:
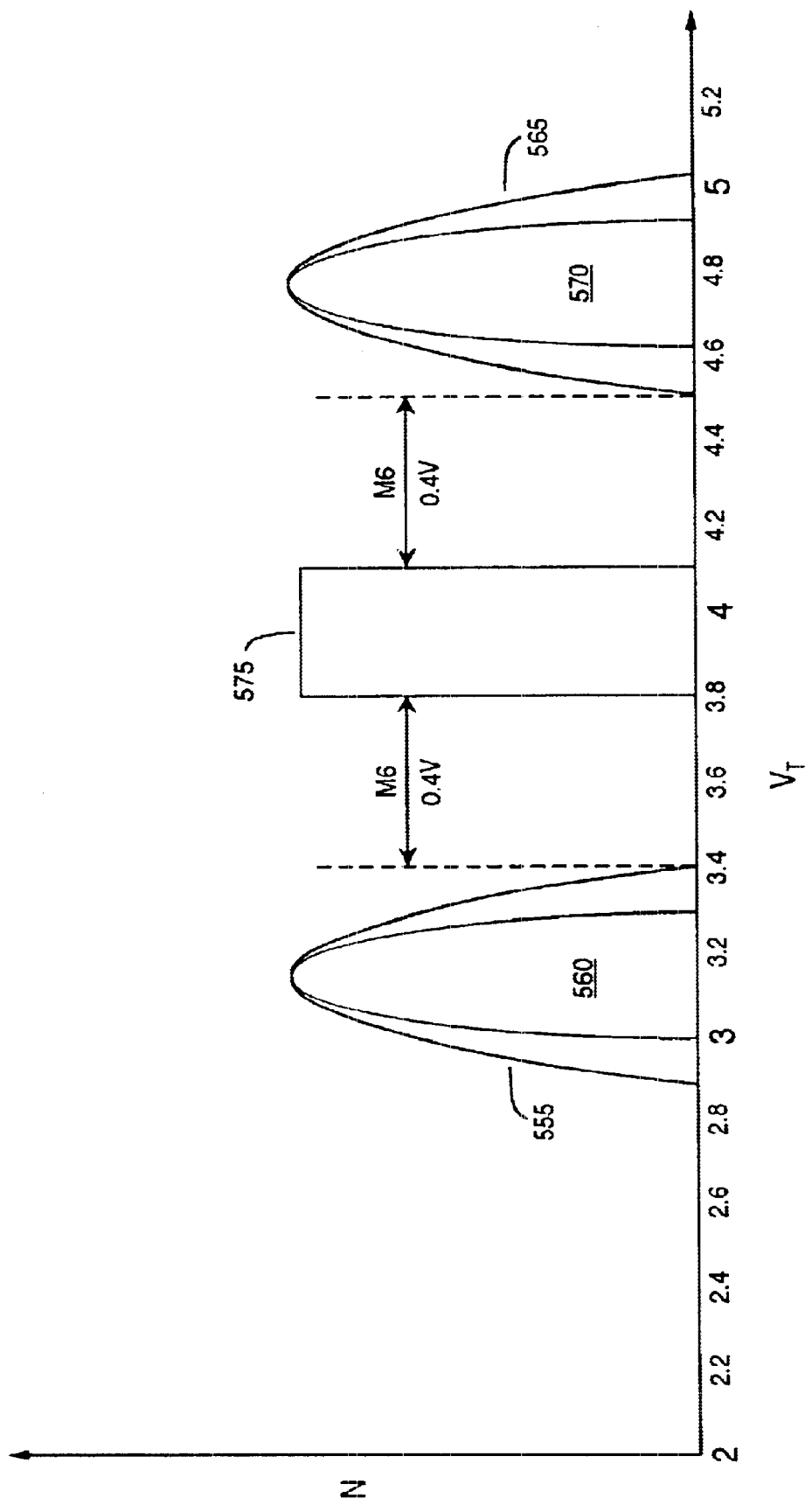
FIG. 5C shows an example of the $V_t$ distributions in a memory cell array with a core memory cell distribution width of 0.5V and a reference cell $V_t$ distribution width of 0.3 volt in accordance with an embodiment of the present claimed invention.

FIG. 5C shows an example of the $V_t$ distributions in a memory cell array with a core memory cell distribution width of 0.5V (555, 565) and a reference cell $V_t$ distribution width of 0.3V volt in accordance with an embodiment of the present claimed invention. In this example, the width of the reference distribution (560, 570) is relaxed to 0.3V from the 0.1V of FIG. 5A. In spite of the increased reference distribution width, the read margin M6 is still 0.4V. This compares favorably to the scheme of FIG. 4A in which the core distribution width is 0.5V (405, 410) and the read margin M1 only 0.3V.

In the examples present above, the $V_t$ distributions for the two states were shown as being the same. In practice, the distributions of the two states may have different characteristics. Also, the use of two different programming processes for the core and reference cells may be restricted to one memory cell state. Although the largest improvement in read margin is achieved by narrowing the reference array $V_t$ distribution for both states, it may be desirable to limit the fine pulse programming of the reference array to one of the two states.

While the present invention of a method for improving read margin in a flash memory device has been described in particular embodiments, it should be appreciated that the present invention should not be construed as limited by such embodiments, but rather construed according to the below claims.

What is claimed is:

1. A method for improving read margin in a flash memory device comprising a dynamic reference memory array and a core memory array, said method comprising:

programming said core memory array to produce a first threshold voltage ($V_t$) distribution with a first distribution width;

programming said dynamic reference memory array to produce a second $V_t$ distribution having a second distribution width; and wherein said second distribution width is less than said first distribution width.

2. The method of claim 1, wherein said programming comprises injecting charge into a dielectric storage element.

3. The method of claim 1, further comprising:

using a first pulse to program said core memory array;

using a second pulse to program said dynamic reference memory array; and wherein said second pulse has a shorter duration than said first pulse.

4. The method of claim 1, further comprising:

using a first pulse to program said core memory array;

using a second pulse to program said dynamic reference memory array; and wherein said second pulse has a smaller amplitude than said first pulse.

5. The method of claim 1, wherein said first distribution width is about 0.5V and said second distribution width is about 0.1V.

6. The method of claim 1, wherein said first distribution width is about 0.7V and said second distribution width is about 0.1V.

7. The method of claim 1, wherein said first distribution width is about 0.5V and said second distribution width is about 0.3V.

8. A method for programming a flash memory device comprising a core memory cell array and a dynamic reference memory cell array, said method comprising:

applying a first programming pulse to said core memory cell array using a first write/verify cycle;

applying a second programming pulse to said reference memory cell array using a second write/verify cycle; and wherein said second pulse is finer than said first pulse.

9. The method of claim 8, wherein said first write/verify cycle is the same as said second write/verify cycle.

10. The method of claim 8, wherein said second write/verify cycle is different from said first write/verify cycle.

11. The method of claim 8, wherein said second pulse has a duration that is shorter than the duration of said first pulse.

12. The method of claim 8, wherein said second pulse has an amplitude that is smaller than the amplitude of said first pulse.

13. The method of claim 8, wherein said core memory cell array and said dynamic reference memory cell array are programmed to a single state.

14. The method of claim 8, wherein said programming comprises soft programming of an erased memory cell.

15. A method for programming a flash memory device comprising a core memory cell array and a dynamic reference memory cell array, said method comprising:

programming a first portion of said core memory cell array to a first state using a first programming process; and programming a first portion of said reference memory cell array to a first state using a second programming process that is finer than said first programming process.

16. The method of claim 15, wherein said first programming process uses a first pulse and said second programming process uses a second pulse that is shorter in duration than said first pulse.

17. The method of claim 15, wherein said first programming process uses a first pulse and said second programming process uses a second pulse that is smaller in amplitude than said first pulse.

18. The method of claim 15, further comprising:

programming a second portion of said core memory cell array to a second state using a third programming process; and programming a second portion of said reference memory cell array to a second state using a fourth programming process that is finer than said third programming process.

19. The method of claim 18, wherein said third programming process uses a third pulse and said fourth programming process uses a fourth pulse that is shorter in duration than said third pulse.

20. The method of claim 18, wherein said third programming process uses a third pulse and said fourth programming process uses a fourth pulse that is smaller in amplitude than said third pulse.

* * * * *